(12) United States Patent
Sellers et al.

(10) Patent No.: US 7,068,033 B2
(45) Date of Patent: Jun. 27, 2006

(54) ACOUSTICALLY DAMPED GRADIENT COIL

(75) Inventors: Michael Ben Sellers, Florence, SC (US); Tomas Duby, Florence, SC (US); Neil Clarke, Florence, SC (US); Anthony Mantone, Florence, SC (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 10/642,846

(22) Filed: Aug. 18, 2003

(65) Prior Publication Data

US 2005/0040825 A1    Feb. 24, 2005

(51) Int. Cl.
*G01V 3/00* (2006.01)

(52) U.S. Cl. ............... 324/318; 324/320; 324/322; 324/307; 324/309

(58) Field of Classification Search ............ 600/407, 600/410, 415; 324/300–322; 335/296, 299
See application file for complete search history.

(56) References Cited

U.S. PATENT DOCUMENTS

| | | | | |
|---|---|---|---|---|
| 4,084,676 A * | 4/1978 | Motyka et al. | ............... | 194/297 |
| 4,636,729 A * | 1/1987 | Maurer et al. | ............... | 324/318 |
| 4,737,716 A * | 4/1988 | Roemer et al. | ............... | 324/319 |
| 4,954,781 A | 9/1990 | Hirata | ............... | 324/318 |
| 5,235,283 A * | 8/1993 | Lehne et al. | ............... | 324/318 |
| 5,256,969 A * | 10/1993 | Miyajima et al. | ............... | 324/318 |
| 5,345,177 A | 9/1994 | Sato et al. | ............... | 324/318 |
| 5,481,191 A * | 1/1996 | Rzedzian | ............... | 324/318 |
| 5,570,021 A * | 10/1996 | Dachniwskyj et al. | ...... | 324/318 |
| 5,764,059 A * | 6/1998 | Mansfield et al. | ............ | 324/318 |
| 5,990,680 A * | 11/1999 | Mansfield | ............... | 324/318 |
| 6,011,394 A * | 1/2000 | Petropoulos et al. | ......... | 324/318 |
| 6,075,363 A * | 6/2000 | Sellers et al. | ............... | 324/318 |
| 6,107,799 A | 8/2000 | Sellers et al. | ............... | 324/318 |
| 6,208,141 B1 * | 3/2001 | Amor et al. | ............... | 324/318 |
| 6,252,404 B1 * | 6/2001 | Purgill et al. | ............... | 324/318 |
| 6,414,489 B1 * | 7/2002 | Dean et al. | ............... | 324/318 |
| 6,437,568 B1 * | 8/2002 | Edelstein et al. | ............ | 324/318 |
| 6,441,614 B1 * | 8/2002 | Edelstein et al. | ............ | 324/318 |
| 6,456,074 B1 | 9/2002 | Minas | ............... | 324/318 |
| 6,492,816 B1 * | 12/2002 | Feenan | ............... | 324/318 |

(Continued)

FOREIGN PATENT DOCUMENTS

EP    1193507 A2    3/2002

(Continued)

OTHER PUBLICATIONS

UK search report for App. No. GB0418130.1 dated Jan. 21, 2005.

*Primary Examiner*—Diego Gutierrez
*Assistant Examiner*—Tiffany A. Fetzner
(74) *Attorney, Agent, or Firm*—McAndrews, Held & Malloy, Ltd.; Peter J. Vogel; Michael A. Dellapenna

(57) ABSTRACT

A magnetic resonance imaging (MRI) device includes an inner gradient coil assembly proximate a patient positioning area, an outer gradient coil assembly proximate a magnet assembly, and a damping layer sandwiched between the inner and outer gradient coil assemblies.

15 Claims, 3 Drawing Sheets

U.S. PATENT DOCUMENTS

| | | |
|---|---|---|
| 6,584,337 B1 * | 6/2003 | Dumoulin et al. .......... 600/410 |
| 6,940,281 B1 * | 9/2005 | Feenan et al. .............. 324/318 |
| 2002/0008516 A1 | 1/2002 | Dietz ......................... 324/318 |
| 2003/0025582 A1 * | 2/2003 | Arz et al. ................... 335/296 |
| 2003/0088172 A1 * | 5/2003 | Kuth .......................... 600/407 |
| 2005/0040825 A1 * | 2/2005 | Sellers et al. .............. 324/318 |
| 2005/0134269 A1 * | 6/2005 | Feenan et al. .............. 324/318 |

FOREIGN PATENT DOCUMENTS

| | | |
|---|---|---|
| EP | 1193507 A3 | 2/2004 |
| GB | WO01/25808 A1 * | 4/2001 |
| JP | 1303140 | 12/1989 |
| JP | 9000507 | 1/1997 |

* cited by examiner

ACOUSTICALLY DAMPED GRADIENT COIL

BACKGROUND OF THE INVENTION

The present invention generally relates to magnetic resonance imaging (MRI) systems, and more particularly to MRI systems that include acoustically damped gradient coils.

Typical MRI devices include a magnet assembly that generates a magnetic field in the presence of at least one gradient coil assembly configured to produce magnetic field gradients in response to the magnetic field. The gradient coil assembly includes a plurality of coils that typically produce three magnetic field gradients, each of which is oriented in a perpendicular fashion with respect to one other (e.g., along x, y, and z-axes). MRI procedures are further discussed in U.S. Pat. No. 6,584,337, entitled "Method and System for Extended Volume Imaging Using MRI," which is hereby incorporated by reference in its entirety.

During an MRI procedure, an electromagnetic force is exerted on the gradient coil causing the gradient coil to vibrate. The vibration of the gradient coil causes vibratory acoustic energy. Often, the vibratory acoustic energy is translated throughout the MRI device, thereby producing acoustic noise. The acoustic noise caused by the vibration of the gradient coil may exceed the ambient background noise. The excessive noise generated during an MRI procedure may be unsettling to patients and irritating to physicians and x-ray technicians.

In order to alleviate the amount of acoustic noise generated by the vibration of gradient coils, rubber dampers have been positioned between a gradient coil and a bobbin that supports the gradient coil. The rubber dampers act to decrease the transmission of acoustic energy from the gradient coil to the bobbin. Further, U.S. Pat. No. 5,345,177, entitled "Magnetic Resonance Imaging Apparatus Having Vibration Damping Means on Gradient Coil" (the '177 patent), discloses a vibration damping means disposed between the gradient coil assembly and a structure that supports the gradient coil.

Additionally, U.S. Pat. No. 4,954,781, entitled "Nuclear Magnetic Resonance Imaging Apparatus with Reduced Acoustic Noise" (the '781 patent) discloses a "sandwich structure" that is located between a body to be examined and a main magnet. The sandwich structure includes a viscoelastic layer sandwiched by first and second sandwiching members.

Further, U.S. Pat. No. 6,107,799, entitled "Noise Reduction Arrangement for a Magnetic Resonance Tomography Apparatus" (the '799 patent) discloses at least one noise-reducing pillow positioned between a gradient coil and a magnet assembly.

Despite the efforts to reduce the amount of acoustic noise within MRI systems described above, many MRI systems still produce levels of acoustic noise that are unsettling to patients and technicians alike. Thus, a need exists for a magnetic resonance imaging system and method that produces less acoustic noise.

BRIEF SUMMARY OF THE INVENTION

Certain embodiments of the present invention provide a magnetic resonance imaging (MRI) device that includes a magnet assembly for generating a magnetic field, a patient positioning area, a first gradient coil assembly proximate the patient positioning area configured to produce a magnetic field gradient in response to the presence of a magnetic field generated by the magnet assembly, a second gradient coil assembly proximate the magnet assembly configured to block the magnetic field gradient generated by the inner gradient coil assembly from radiating outwardly from the MRI device, and a damping layer sandwiched between the first and second gradient coil assemblies. The damping layer may include at least one high modulus cylinder sandwiched between two viscoelastic layers. The damping layer may also include a plurality of high modulus cylinders, such that each high modulus cylinder is positioned between at least two viscoelastic layers. Optionally, the damping layer may not include a high modulus cylinder.

The high modulus cylinder may be composed of ceramic, glass filament wound tube, carbon fiber, or any other non-conductive material having a high modulus. Each viscoelastic layer may be composed of rubber, foam, or any other material with a significant damping coefficient or viscoelasticity. The MRI device may include at least one additional damping layer positioned between the second gradient coil assembly and the magnet assembly. At least one additional damping layer may be positioned between the first gradient coil assembly and the patient positioning area.

Figure 1:
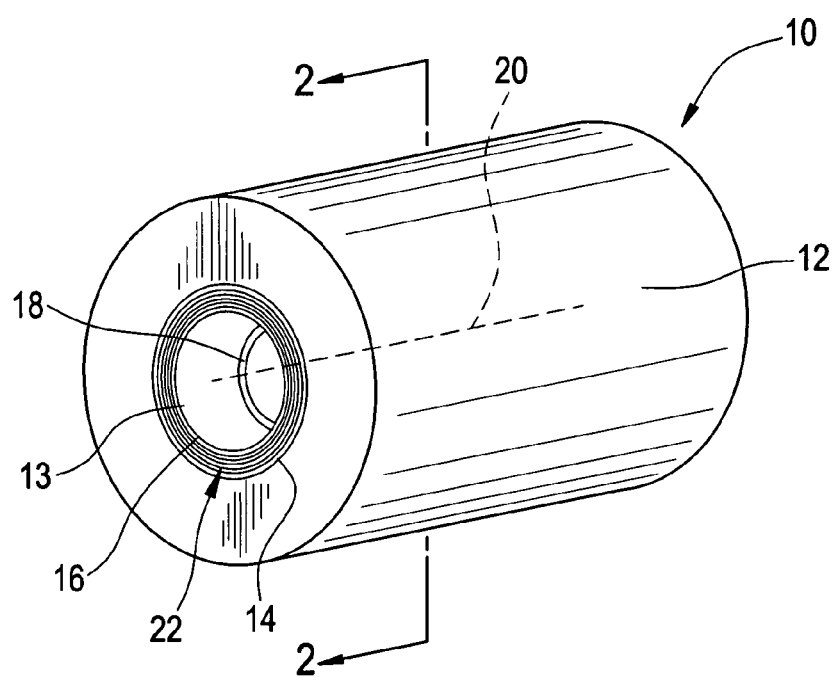
FIG. 1 illustrates an isometric view of a Magnetic Resonance Imaging (MRI) device according to an embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentalities shown in the attached drawings.

DETAILED DESCRIPTION OF THE INVENTION

FIG. 1 illustrates an isometric view of a Magnetic Resonance Imaging (MRI) device 10 according to an embodiment of the present invention. The MRI device 10 includes a magnet assembly 12 that surrounds an outer gradient coil assembly 14, an inner gradient coil assembly 16, and a radio frequency (RF) coil assembly 18. The RF coil assembly 18 may be a separate, stand alone tube disposed within the MRI device 10. A patient positioning area 13 is defined within the MRI device 10 through the longitudinal axis 20 of the MRI device 10. A damping layer 22 is disposed between the outer gradient coil assembly 14 and the inner gradient coil assembly 16. The damping layer 22 may include one or more high modulus cylinders (as shown in FIG. 2).

In operation, the magnet assembly 10 produces a static magnetic field, while the inner gradient coil assembly 16 generates a magnetic field gradient for use in producing magnetic resonance (MR) images. The RF coil assembly 18 transmits a radio frequency pulse and detects a plurality of MR signals induced from a subject being imaged. The outer gradient coil assembly 14 shields or blocks the magnetic field gradient generated by the inner gradient coil assembly 16 from radiating outwardly from the MRI device 10. The damping layer 22 disposed between the inner gradient coil assembly 16 and the outer gradient coil assembly 14 dampens vibrations produced within the MRI device 10 during imaging. In particular, the damping layer 22 dampens vibratory acoustic energy, and therefore acoustic noise, produced by vibrations of the inner gradient coil 16 and/or the outer gradient coil 14 during an imaging procedure. The reduced amount of acoustic noise produced by the MRI device 10 provides a more patient-friendly system and method of magnetic resonance imaging.

Figure 2:
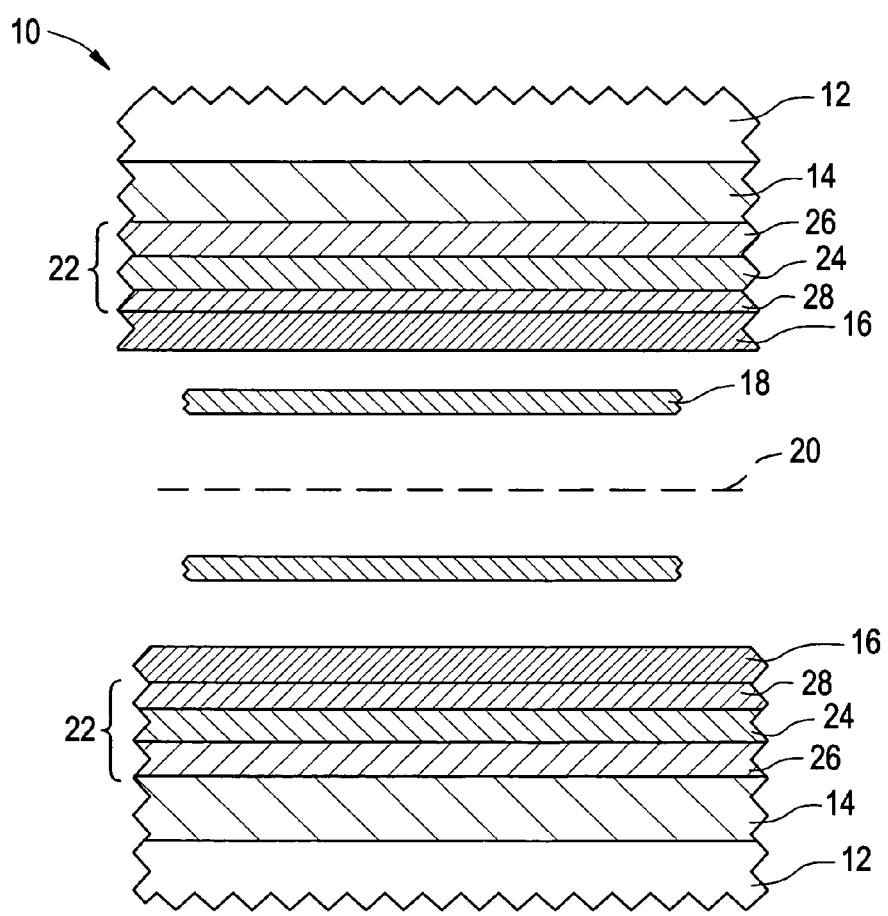
FIG. 2 illustrates a partial transverse cross sectional view of the MRI device along line 2—2 of FIG. 1.

FIG. 2 illustrates a partial transverse cross sectional view of the MRI device 10 along line 2—2 of FIG. 1. As mentioned above, the damping layer 22 is formed between the inner gradient coil assembly 16 and the outer gradient coil assembly 14. The damping layer 22 may be secured, affixed, or otherwise fastened to the inner and outer gradient coil assemblies 16, 14 through an epoxy glue, or other such fastening agent. The damping layer 22 may include a plurality of layers therein. For example, the damping layer 22 may include a high modulus cylinder 24 sandwiched between an outer viscoelastic layer 26 and an inner viscoelastic layer 28. As shown in FIG. 2, the inner and outer gradient coil assemblies 16, 14 do not directly contact one another. Rather, the inner and outer gradient coil assemblies 16, 14 are separated by the damping layer 22. Further, the damping layer may include more or fewer high modulus cylinders 24 sandwiched between viscoelastic layers. For example, instead of having two visoelastic layers and one high modulus cylinder as shown in FIG. 2, the damping layer 22 may include two high modulus cylinders each disposed between two viscoelastic layers, with one viscoelastic layer being common to two of the high modulus cylinders. Optionally, the damping layer 22 may not include a high modulus cylinder 24. Instead, the damping layer 22 may be formed of one or more viscoelastic materials.

The viscoelastic layers 26 and 28 may be rubber, foam (such as polyester or urethane foam), various other polymer materials, or similar materials. The high modulus cylinder 24 may be ceramic, glass filament wound tube, carbon fiber, or the like. Configuring the damping layer so that the high modulus cylinder 24 is sandwiched between the viscoelastic layers 26 and 28 efficiently dampens vibrations between the inner gradient coil 16 and the outer gradient coil 14. It has been found that constrained layer damping, in which a softer layer is sandwiched between two stiffer layers, or vice versa, dampens a greater amount of energy produced by vibrations as compared to a single layer, or adjacent layers having similar physical properties.

During an imaging process, the inner and outer gradient coil assemblies 16, 14 may vibrate. The energy of the resulting vibrations is translated through the MRI device 10. The energy is translated into the damping layer 22, which absorbs at least a portion of the vibratory acoustic energy, thereby damping the vibration within the MRI device 10. Because the vibration is damped within the damping layer 22, less vibratory acoustic energy travels to and from the inner and outer gradient coil assemblies 16, 14. That is, the vibrations from the inner gradient coil assembly 16 are not substantially transmitted to the outer gradient coil assembly 14, or vice versa, because the damping layer 22 substantially absorbs the vibrations, and therefore substantially reduces the amount of sound energy, or acoustic noise, produced within the MRI device 10 by the transmitted vibrations.

As a vibration travels from one of the gradient coil assemblies 14, 16 into the damping layer 22, an impedance mismatch occurs between each of the gradient coil assemblies 14, 16 and the damping layer 22 due to the fact that the gradient coils 14, 16 have different physical properties than the damping layer 22. The transmission of the vibration, or vibratory sound wave, is substantially absorbed by the damping layer 22. Because no part of the inner gradient coil assembly 16 directly contacts the outer gradient coil assembly 14, vibrations generated within either gradient coil assembly 14, 16 are substantially absorbed by the damping layer 22 and not transmitted between the gradient coil assemblies 14, 16. Because less sound energy caused by vibrations travels between the inner and outer gradient coil assemblies 16, 14, the inner and outer gradient coil assemblies 16, 14 do not vibrate and/or resonate as much as they would if the damping layer 22 was not disposed therebetween. Similarly, an impedance mismatch occurs between each of the viscoelastic layers 26, 28 and the high modulus cylinder 24 (due to the difference in physical properties), thereby further absorbing vibratory sound energy within the damping layer 22. Thus, the MRI device 10 produces less acoustic noise due to the vibratory acoustic energy absorbing qualities of the damping layer 22.

Additionally, a damping layer, such as damping layer 22, may be positioned on both sides of the inner gradient coil assembly 16. Further, a damping layer, such as damping layer 22, may be positioned between the outer gradient coil assembly 14 and the magnet assembly 12.

Figure 3:
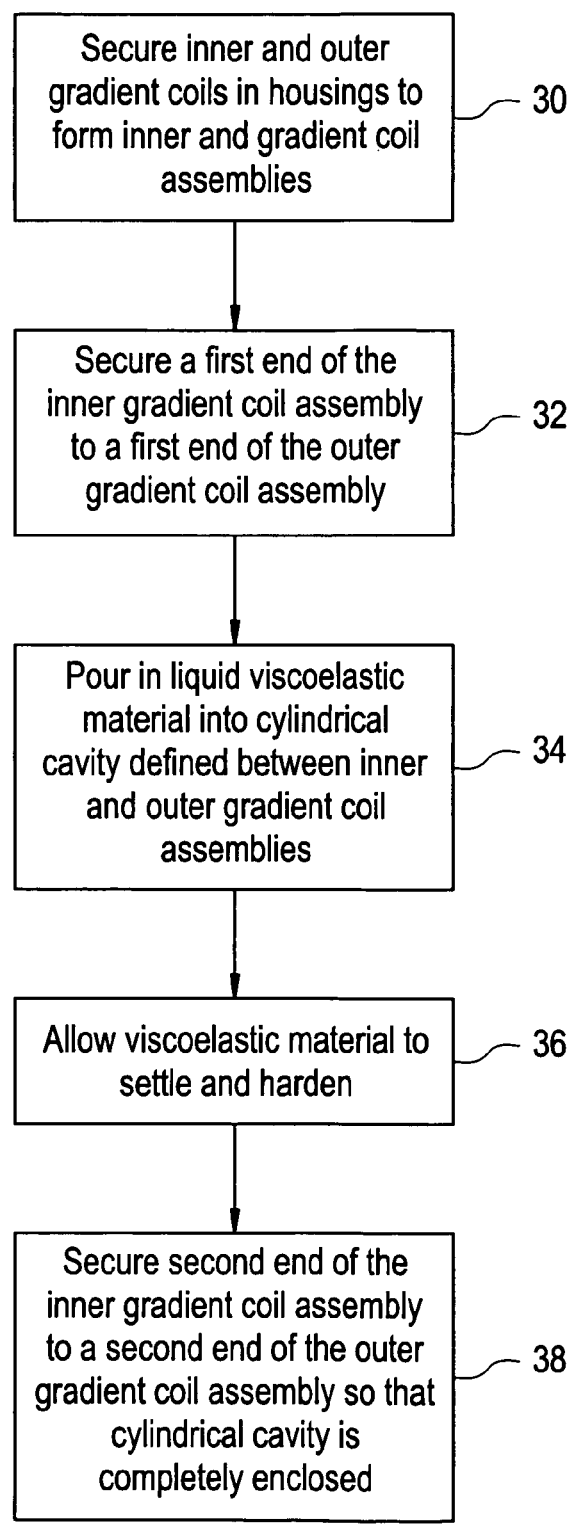
FIG. 3 is a flow chart of a manufacturing process for an MRI device according to an embodiment of the present invention.

FIG. 3 is a flow chart of a manufacturing process for an MRI device according to an embodiment of the present invention. At 30, inner and outer gradient coils are secured within cylindrical housings to form inner and outer gradient coil assemblies. The inner gradient coil assembly is then oriented in an upright fashion such that one end is supported by a horizontal base (such as a floor in a manufacturing facility).

At 32, a first end of the inner gradient coil assembly is secured to a first end of the outer gradient coil assembly such that a cylindrical cavity (or inner space) is formed between the inner gradient coil assembly and the outer gradient coil assembly. An end of the cylindrical cavity that is proximate the horizontal base is sealed off by a blocking member that connects the first ends of the inner and outer gradient coil assemblies. Thus, the cylindrical cavity may receive and retain liquid material.

At 34, liquid viscoelastic material, such as liquid rubber or foam, is poured into the cylindrical cavity, i.e., inner space, defined between the inner and outer gradient coil assemblies. Optionally, a high modulus cylinder may be disposed within the cylindrical cavity before the liquid viscoelastic material is poured into the cylindrical cavity. The high modulus cylinder may be positioned within the cylindrical cavity such that neither the inner gradient coil assembly, nor the outer gradient coil assembly directly contacts the high modulus cylinder. At 36 the viscoelastic material is allowed to settle and harden within the cylindrical cavity thereby forming a damping layer. At 38, the second ends of the inner and outer gradient coil assemblies are secured together, such as through another blocking member, so that the cylindrical cavity formed between the inner and outer gradient coil assemblies is enclosed.

Thus, embodiments of the present invention reduce the amount of vibratory sound energy produced during a magnetic resonance imaging procedure through the use of gradient coil assemblies having an integrated viscoelastic layer. Embodiments of the present invention may be used with all gradient coils having an inner and outer assembly, regardless of the shape, size and form of each coil.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A magnetic resonance imaging (MRI) device, comprising:
    an inner gradient coil assembly directly adjacent a patient positioning area along the horizontal length of the inner gradient coil assembly;
    an outer gradient coil assembly directly adjacent a magnet assembly along the horizontal length of the outer gradient coil assembly; and
    a damping layer sandwiched directly between said inner and outer gradient coil assemblies, along the horizontal length of the inner and outer gradient coil assemblies, said damping layer comprising at least two vertically separated non-contacting viscoelastic layers, with each viscoelastic layer consisting of at least one of foam or rubber, and at least one high modulus cylinder sandwiched between said two vertically separated non-contacting viscoelastic layers.

2. The MRI device of claim 1, wherein said high modulus cylinder is composed of at least one of ceramic, glass filament wound tube, carbon fiber, and another non-conductive material exhibiting a high modulus.

3. The MRI device of claim 1, further comprising at least one additional damping layer consisting of at least one of foam or rubber positioned between said outer gradient coil assembly and said magnet assembly, along the horizontal length of the outer gradient coil assembly and said magnet assembly.

4. The MRI device of claim 1, further comprising at least one additional damping layer consisting of at least one of foam or rubber positioned between said inner gradient coil assembly and said patient positioning area, along the horizontal length of the inner gradient coil assembly and said patient positioning area.

5. The MRI device of claim 1, wherein said damping layer comprises a plurality of high modulus cylinders, and wherein each of said plurality of high modulus cylinders is positioned between at least two vertically separated non-contating viscoelastic layers consisting of at least one of foam or rubber.

6. The MRI device of claim 1, wherein said inner gradient coil assembly generates a magnetic field gradient in response to the presence of a magnetic field generated by said magnet assembly; and wherein said outer gradient coil assembly shields the magnetic field gradient generated by said inner gradient coil assembly from radiating outwardly from the MRI device.

7. A method of manufacturing a magnetic resonance imaging (MRI) device, comprising:
    forming a space between a first gradient coil assembly and a second gradient coil assembly;
    positioning at least one high modulus cylinder in the space before pouring a liquid viscoelastic material consisting of at least one foam or rubber into the space;
    allowing the liquid viscoelastic material to solidify within the space in order to form a vertically separated damping layer along the horizontal length of the space between the first gradient coil assembly and the second gradient coil assembly, with the damping layer comprising at least one high modulus cylinder sandwiched between at least two vertically separated non-contacting viscoelastic layers, with each viscoelastic layer consisting of at least one of foam or rubber.

8. The method of claim 7, wherein the high modulus cylinder is at least one of ceramic, glass filament would tube, and carbon fiber.

9. The method of claim 7, further comprising positioning a plurality of high modulus cylinders before the pouring step in the space such that each of the plurality of high modulus cylinder does not directly contact another high modulus cylinder, the first gradient coil, and the second gradient coil.

10. A magnetic resonance imaging (MRI) device, comprising:
    a magnet assembly configured to generate a magnetic field;
    a patient positioning area;
    a first gradient coil assembly directly adjacent said patient positioning area, along the length of the first gradient coil assembly, configured to produce a magnetic field gradient in response to the presence of a magnetic field generated by said magnet assembly;
    a second gradient coil assembly directly adjacent said magnet assembly, along the length of the first gradient coil assembly, configured to block the magnetic field gradient generated by said first gradient coil assembly from radiating outwardly from the MRI device; and
    a damping layer sandwiched between said first and second gradient coil assemblies, along the length of the first and second gradient coil assemblies, wherein said damping layer comprises at least one high modulus cylinder sandwiched between two vertically separated non-contacting viscoelastic layers consisting of at least one of foam or rubber.

11. The method of claim 10, wherein the high modulus cylinder is at least one of ceramic, glass filament wound tube, and carbon fiber.

12. The MRI device of claim 10, further comprising at least one additional damping layer consisting of at least one foam or rubber positioned between said second gradient coil assembly and said magnet assembly, along the horizontal length of the second gradient coil assembly and said magnet assembly.

13. The MRI device of claim 10, further comprising at least one additional damping layer consisting of at least one of foam or rubber positioned between said first gradient coil assembly and said patient positioning area, along the horizontal length of the first gradient coil assembly and said patient positioning area.

14. The MRI device of claim 10, wherein said damping layer comprises a plurality of high modulus cylinders, and wherein each of said plurality of high modulus cylinders is positioned between at least two vertically separated non-contacting viscoelastic layers consisting of at least one of foam or rubber.

15. The MRI device of claim 10, further comprising a radiofrequency (RF) coil assembly configured to transmit a radiofrequency pulse and detect a plurality of MR signals induced from a subject being imaged.

* * * * *